US009008695B2

(12) United States Patent
Do et al.

(10) Patent No.: US 9,008,695 B2
(45) Date of Patent: Apr. 14, 2015

(54) METHOD, SYSTEM AND/OR DEVICE FOR ADJUSTING EXPECTED RECEIVED SIGNAL STRENGTH SIGNATURE VALUES

(71) Applicant: QUALCOMM Incorporated, San Diego, CA (US)

(72) Inventors: Ju-Yong Do, Palo Alto, CA (US); Sai Pradeep Venkatraman, Santa Clara, CA (US); Weihua Gao, San Jose, CA (US); Gengsheng Zhang, Cupertino, CA (US); Lionel Jacques Garin, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 13/736,910

(22) Filed: Jan. 8, 2013

(65) Prior Publication Data

US 2014/0194145 A1     Jul. 10, 2014

(51) Int. Cl.
*H04W 24/00* (2009.01)
*H04W 4/02* (2009.01)
*H04B 17/00* (2006.01)
*G01S 5/02* (2010.01)
*G01S 5/14* (2006.01)

(52) U.S. Cl.
CPC ............ *H04W 4/02* (2013.01); *H04B 17/00* (2013.01); *G01S 5/021* (2013.01); *G01S 5/0252* (2013.01); *G01S 5/14* (2013.01)

(58) Field of Classification Search
CPC ........ H04W 4/02; H04W 4/023; H04W 52/04
USPC ................... 455/456.1, 422.1, 456.6
See application file for complete search history.

(56) References Cited

U.S. PATENT DOCUMENTS

| 7,389,114 | B2 | 6/2008 | Ju et al. | |
|---|---|---|---|---|
| 2004/0203885 | A1* | 10/2004 | Quaid | 455/456.1 |
| 2008/0085692 | A1* | 4/2008 | Hart et al. | 455/187.1 |
| 2008/0130604 | A1 | 6/2008 | Boyd | |
| 2008/0227470 | A1 | 9/2008 | Tien | |
| 2010/0135178 | A1 | 6/2010 | Aggarwal et al. | |
| 2010/0159958 | A1 | 6/2010 | Naguib et al. | |
| 2011/0207474 | A1 | 8/2011 | Hazzani et al. | |
| 2011/0246148 | A1* | 10/2011 | Gupta et al. | 703/2 |
| 2012/0046045 | A1* | 2/2012 | Gupta et al. | 455/456.1 |
| 2012/0056786 | A1 | 3/2012 | Pandey et al. | |
| 2012/0149415 | A1 | 6/2012 | Valaee et al. | |
| 2013/0012227 | A1* | 1/2013 | Nadler et al. | 455/456.1 |
| 2013/0035109 | A1* | 2/2013 | Tsruya et al. | 455/456.1 |
| 2013/0109413 | A1* | 5/2013 | Das et al. | 455/456.6 |

OTHER PUBLICATIONS

International Search Report and Written Opinion—PCT/US2014/010388—ISA/EPO—Apr. 14, 2014.

* cited by examiner

*Primary Examiner* — David Q Nguyen
(74) *Attorney, Agent, or Firm* — Berkeley Law & Technology Group, LLP

(57) ABSTRACT

Disclosed are systems, methods and devices for application of determining position information for mobile devices. In specific implementations, measurement of a signal travel time and a signal's strength may be combined to characterize a transmission power of the signal's transmitter. The characterized transmission power may be applied to affect expected signal strength signature values for use of the signal's transmitter may be updated in order to enhance a location based service where location may be effected by accuracy of a transmitter's power.

22 Claims, 6 Drawing Sheets

Heat Map

| Field | Size(Bytes) | Description |
|---|---|---|
| 202→ A | 2 | Node ID |
| 203→ B | 1 for each AP | RSSI Heat Map Values |
| 204→ C | 1 for each AP | RSSI Variance (optional) |
| 205→ D | 2 for each AP | Delay Heat Map Values |
| 206→ E | 2 for each AP | Delay Variance |
| 207→ F | 1 | Connectivity |

METHOD, SYSTEM AND/OR DEVICE FOR ADJUSTING EXPECTED RECEIVED SIGNAL STRENGTH SIGNATURE VALUES

FIELD

Embodiments described herein are directed to mobile navigation techniques.

INFORMATION

GPS and other like satellite positioning systems have enabled navigation services for mobile handsets in outdoor environments. Since satellite signals may not be reliably received and/or acquired in an indoor environment, different techniques may be employed to enable navigation services. For example, mobile devices may typically obtain a position fix by measuring ranges to three or more terrestrial wireless access points which may positioned at known locations. Such ranges may be measured, for example, by obtaining a MAC ID address from signals received from such access points and measuring one or more characteristics of signals received from such access points such as, for example, received signal strength indicator (RSSI), round trip delay (RTT), just to name a few examples.

BRIEF DESCRIPTION OF THE DRAWINGS

Non-limiting and non-exhaustive aspects are described with reference to the following figures, wherein like reference numerals refer to like parts throughout the various figures unless otherwise specified.

SUMMARY

Figure 1:
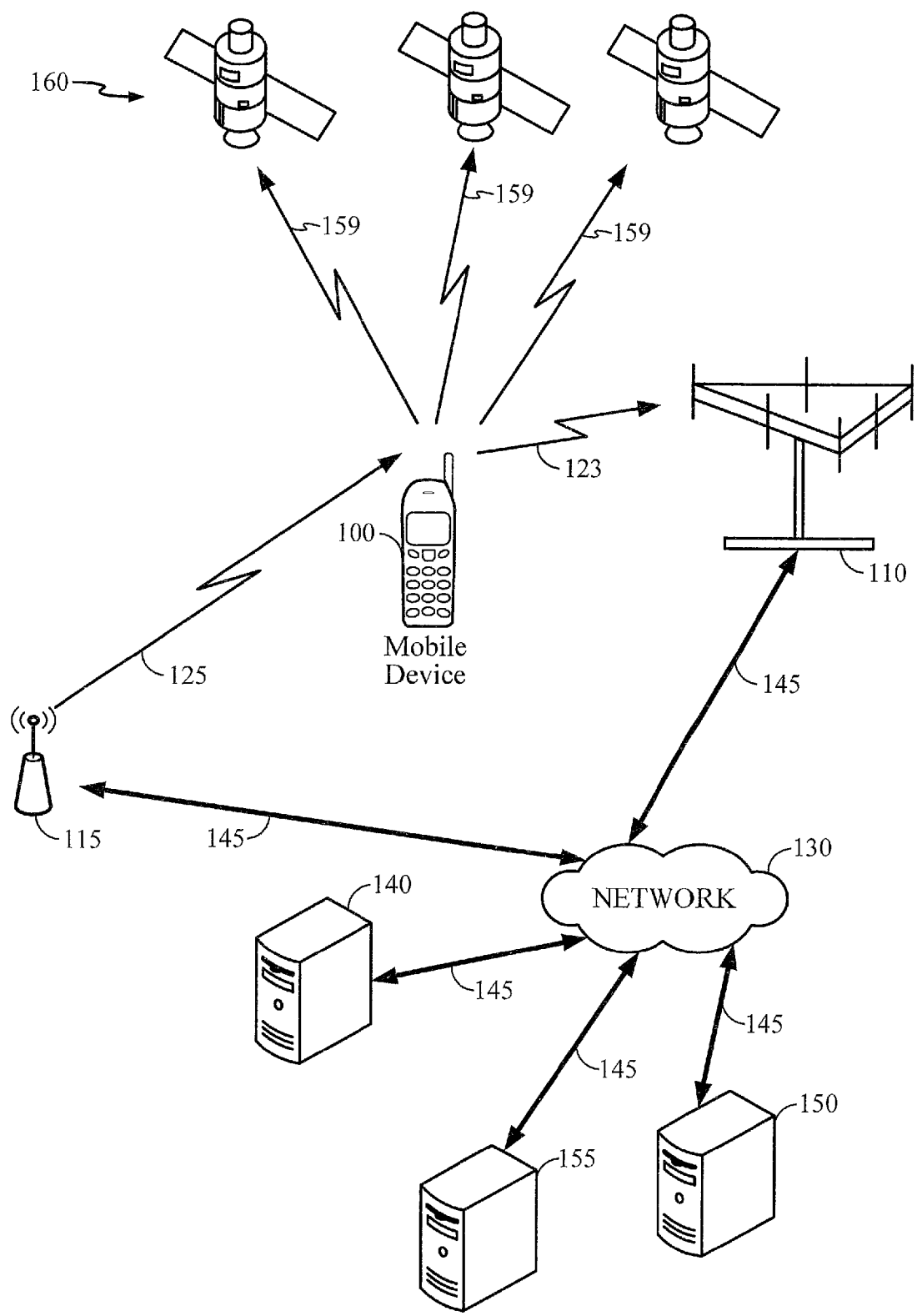
FIG. 1 is a system diagram illustrating certain features of a system containing a mobile device, in accordance with an implementation.

Briefly, particular implementations are directed to a method comprising, at a computing device: obtaining a measurement of travel time of a first signal transmitted between the computing device and a transmitter; obtaining a measurement of a signal strength of a second signal transmitted by the transmitter and received at a receiver; and combining the travel time with the signal strength to adjust one or more expected signal strength signature values for application to subsequent signals acquired from said transmitter.

Another particular implementation is directed to an apparatus comprising: a transceiver to transmit and receive signals over a wireless communication link; and one or more processors to: obtain a measurement of travel time of a first signal transmitted between the transceiver and a remote transmitter; obtain a measurement of a signal strength of a second signal transmitted by said transmitter and received at a receiver; and combine the travel time with the signal strength to adjust one or more expected signal strength signature values for application to subsequent signals acquired from said transmitter.

Another particular implementation is directed to an article comprising: a non-transitory storage medium comprising machine-readable instructions stored thereon which are executable by a special purpose computing apparatus to: obtain a measurement of travel time of a first signal transmitted between a mobile device and a transmitter; obtain a measurement of a signal strength of a second signal transmitted by said transmitter and received at said mobile device; and combine the travel time with the signal strength to adjust one or more expected signal strength signature values for application to subsequent signals acquired from said transmitter.

Another particular implementation is directed to an apparatus comprising: means for obtaining a measurement of travel time of a first signal transmitted between the computing device and a transmitter; means for obtaining a measurement of a signal strength of a second signal transmitted by said transmitter and received at a receiver; and means for combining the travel time with the signal strength to adjust one or more expected signal strength signature values for application to subsequent signals acquired from said transmitter.

It should be understood that the aforementioned implementations are merely example implementations, and that claimed subject matter is not necessarily limited to any particular aspect of these example implementations.

DETAILED DESCRIPTION

As pointed out above, a mobile device may apply any one of several techniques for obtaining a position fix based, at least in part, on measurements obtained from acquisition of signals while in an indoor environment. One particular indoor navigation technique involves application of measured characteristics of acquired signals to expected signature values stored in a "radio heatmap." In one application, a radio heatmap may store expected signature values for multiple discrete locations over an area of interest. These signature values may comprise expected values of received signal strength or round trip time for signals acquired at a mobile device and transmitted by local transmitters. A location of the mobile device may be estimated or approximated as a location indicated in the heatmap associated with the expected signature values providing the closest match with measurements obtained at the mobile device from acquiring signals.

A radio heatmap for applying an RSSI value of a signal acquired from a transmitter to an expected RSSI signature value for use in obtaining a position fix may presume a known, predictable or stable transmission power applied at the transmitter. In practice, however, transmission power at a transmitter (e.g., at an IEEE Std. 802.11 access point) may vary or drift over time. For example, transmission power of a transmitter at an IEEE Std. 802.11 access point may vary up to 21.0 dBm (−1.0 dBm to 20.0 dBm). This process of drift in transmit power often occurs slowly over hours or days. Nevertheless, such a variation in transmission power at a transmitter may affect accuracy of received signal strength indicator RSSI expected signature values in a radio heatmap.

According to an embodiment, a radio heatmap for signal strength signature values may be updated from time to time based, at least in part, on measurements obtained by mobile devices capable of obtaining both RTT measurements and RSSI measurements. These values may be based, at least in part, on observed changes in transmission power at a transmitter. A mobile device may obtain an RTT measurement with respect to a transceiver by transmitting a probe signal and receiving an acknowledgement message from the transceiver in response to probe signal. In the absence of multipath and with knowledge of a processing latency at the transceiver in acquiring the probe signal and transmitting the acknowledgement message, a range from the mobile device to the transceiver may be accurately measured. Even in the presence of multipath conditions, outlier detection techniques may be used to remove erroneous multipath detections. A comparison of a range computed based on an RTT range measurement with a range computed based on an RSSI measurement of a signal transmitted by a particular transmitter may be used to update expected signature values for RSSI of the signal transmitted by the transmitter (e.g., following transmission power drift as discussed above). The comparison of the range computed based on the RTT range measurement with the range computed based on the RSSI measurement may be used to update an expected transmission power of the transmitter. Based, at least in part, on the updated transmission power, expected RSSI signature values for a transmitter in a radio heatmap may be adjusted to be consistent with the current, updated transmission power level.

In certain implementations, as shown in FIG. 1, a mobile device 100 may receive or acquire satellite positioning system (SPS) signals 159 from SPS satellites 160. In some embodiments, SPS satellites 160 may be from one global navigation satellite system (GNSS), such as the GPS or Galileo satellite systems. In other embodiments, the SPS Satellites may be from multiple GNSS such as, but not limited to, GPS, Galileo, Glonass, or Beidou (Compass) satellite systems. In other embodiments, SPS satellites may be from any one several regional navigation satellite systems (RNSS') such as, for example, Wide Area Augmentation System (WAAS), European Geostationary Navigation Overlay Service (EGNOS), Quasi-Zenith Satellite System (QZSS), just to name a few examples.

In addition, mobile device 100 may transmit radio signals to, and receive radio signals from, a wireless communication network. In one example, mobile device 100 may communicate with a cellular communication network by transmitting wireless signals to, or receiving wireless signals from, base station transceiver 110 over wireless communication link 123. Similarly, mobile device 100 may transmit wireless signals to, or receive wireless signals from local transceiver 115 over wireless communication link 125.

In a particular implementation, local transceiver 115 may be configured to communicate with mobile device 100 at a shorter range over wireless communication link 125 than at a range enabled by base station transceiver 110 over wireless communication link 123. For example, local transceiver 115 may be positioned in an indoor environment. Local transceiver 115 may provide access to a wireless local area network (WLAN, e.g., IEEE Std. 802.11 network) or wireless personal area network (WPAN, e.g., Bluetooth network). In another example implementation, local transceiver 115 may comprise a femto cell transceiver capable of facilitating communication on link 125 according to a cellular communication protocol. Of course it should be understood that these are merely examples of networks that may communicate with a mobile device over a wireless link, and claimed subject matter is not limited in this respect.

In a particular implementation, base station transceiver 110 and local transceiver 115 may communicate with servers 140, 150 and/or 155 over a network 130 through links 145. Here, network 130 may comprise any combination of wired or wireless links. In a particular implementation, network 130 may comprise Internet Protocol (IP) infrastructure capable of facilitating communication between mobile device 100 and servers 140, 150 or 155 through local transceiver 115 or base station transceiver 110. In another implementation, network 130 may comprise cellular communication network infrastructure such as, for example, a base station controller or master switching center (not shown) to facilitate mobile cellular communication with mobile device 100.

In particular implementations, and as discussed below, mobile device 100 may have circuitry and processing resources capable of computing a position fix or estimated location of mobile device 100. For example, mobile device 100 may compute a position fix based, at least in part, on pseudorange measurements to four or more SPS satellites 160. Here, mobile device 100 may compute such pseudorange measurements based, at least in part, on pseudonoise code phase detections in signals 159 acquired from four or more SPS satellites 160. In particular implementations, mobile device 100 may receive from server 140, 150 or 155 positioning assistance data to aid in the acquisition of signals 159 transmitted by SPS satellites 160 including, for example, almanac, ephemeris data, Doppler search windows, just to name a few examples.

In other implementations, mobile device 100 may obtain a position fix by processing signals received from terrestrial transmitters fixed at known locations (e.g., such as base station transceiver 110) using any one of several techniques such as, for example, advanced forward trilateration (AFLT) and/or observed time difference of arrival (OTDOA). In these particular techniques, a range from mobile device 100 may be measured to three or more of such terrestrial transmitters fixed at known locations based, at least in part, on pilot signals transmitted by the transmitters fixed at known locations and received at mobile device 100. Here, servers 140, 150 or 155 may be capable of providing positioning assistance data to mobile device 100 including, for example, locations and identities of terrestrial transmitters to facilitate positioning techniques such as AFLT and OTDOA. For example, servers 140, 150 or 155 may include a base station almanac (BSA) which indicates locations and identities of cellular base stations in a particular region or regions.

In particular environments such as indoor environments or urban canyons, mobile device 100 may not be capable of acquiring signals 159 from a sufficient number of SPS satellites 160 or perform AFLT or OTDOA to compute a position fix. Alternatively, mobile device 100 may be capable of computing a position fix based, at least in part, on signals acquired from local transmitters (e.g., WLAN access points, femto cell transceivers, Bluetooth devices, etc., positioned at known locations). For example, mobile devices may obtain a position fix by measuring ranges to three or more indoor terrestrial wireless access points which are positioned at known locations. Such ranges may be measured, for example, by obtaining a MAC ID address from signals received from such access points and obtaining range measurements to the access points by measuring one or more characteristics of signals received from such access points such as, for example, received signal strength (RSSI) or round trip time (RTT). In alternative implementations, mobile device 100 may obtain an indoor position fix by applying characteristics of acquired signals to a radio heatmap indicating expected RSSI and/or RTT signatures at particular locations in an indoor area. In particular implementations, a radio heatmap may associate identities of local transmitters (e.g., a MAC address which is discernible from a signal acquired from a local transmitter), expected RSSI from signals transmitted by the identified local transmitters, an expected RTT from the identified transmitters, and possibly standard deviations from these expected RSSI or RTT. It should be understood, however, that these are merely examples of values that may be stored in a radio heatmap, and that claimed subject matter is not limited in this respect.

In a particular implementation, mobile device 100 may also apply signals received from a magnetometer to signatures in a magnetic heatmap indicating expected magnetic signatures at particular locations in an indoor area. In particular implementations, for example, a "magnetic heatmap" may associate expected magnetic signatures or compass deviations with locations in an indoor area allowing a mobile device to estimate its location based, at least in part, on an association of magnetic heatmap values with compass or magnetometer measurements obtained at the mobile device.

In particular implementations, mobile device 100 may receive positioning assistance data for indoor positioning operations from servers 140, 150 or 155. For example, such positioning assistance data may include locations and identities of transmitters positioned at known locations to enable measuring ranges to these transmitters based, at least in part, on a measured RSSI and/or RTT, for example. Other positioning assistance data to aid indoor positioning operations may include radio heatmaps, magnetic heatmaps, locations and identities of transmitters, routeability graphs, just to name a few examples. Other assistance data received by the mobile device may include, for example, local maps of indoor areas for display or to aid in navigation. Such a map may be provided to mobile device 100 as mobile device 100 enters a particular indoor area. Such a map may show indoor features such as doors, hallways, entry ways, walls, etc., points of interest such as bathrooms, pay phones, room names, stores, etc. By obtaining and displaying such a map, a mobile device may overlay a current location of the mobile device (and user) over the displayed map to provide the user with additional context.

In one implementation, a routeability graph and/or digital map may assist mobile device 100 in defining feasible areas for navigation within an indoor area and subject to physical obstructions (e.g., walls) and passage ways (e.g., doorways in walls). Here, by defining feasible areas for navigation, mobile device 100 may apply constraints to aid in the application of filtering measurements for estimating locations and/or motion trajectories according to a motion model (e.g., according to a particle filter and/or Kalman filter). In addition to measurements obtained from the acquisition of signals from local transmitters, according to a particular embodiment, mobile device 100 may further apply a motion model to measurements or inferences obtained from inertial sensors (e.g., accelerometers, gyroscopes, magnetometers, etc.) and/or environment sensors (e.g., temperature sensors, microphones, barometric pressure sensors, ambient light sensors, camera imager, etc.) in estimating a location or motion state of mobile device 100.

According to an embodiment, mobile device 100 may access indoor navigation assistance data through servers 140, 150 or 155 by, for example, requesting the indoor assistance data through selection of a universal resource locator (URL). In particular implementations, servers 140, 150 or 155 may be capable of providing indoor navigation assistance data to cover many different indoor areas including, for example, floors of buildings, wings of hospitals, terminals at an airport, portions of a university campus, areas of a large shopping mall, just to name a few examples. Also, memory resources at mobile device 100 and data transmission resources may make receipt of indoor navigation assistance data for all areas served by servers 140, 150 or 155 impractical or infeasible, a request for indoor navigation assistance data from mobile device 100 may indicate a rough or course estimate of a location of mobile device 100. Mobile device 100 may then be provided indoor navigation assistance data covering areas including and/or proximate to the rough or course estimate of the location of mobile device 100.

In one particular implementation, a request for indoor navigation assistance data from mobile device 100 may specify a location context identifier (LCI). Such an LCI may be associated with a locally defined area such as, for example, a particular floor of a building or other indoor area which is not mapped according to a global coordinate system. In one example server architecture, upon entry of an area, mobile device 100 may request a first server, such as server 140, to provide one or more LCIs covering the area or adjacent areas. Here, the request from the mobile device 100 may include a rough location of mobile device 100 such that the requested server may associate the rough location with areas covered by known LCIs, and then transmit those LCIs to mobile device 100. Mobile device 100 may then use the received LCIs in subsequent messages with a different server, such as server 150, for obtaining navigation assistance data relevant to an area identifiable by one or more of the LCIs as discussed above (e.g., digital maps, locations and identifies of beacon transmitters, radio heatmaps or routeability graphs).

In another implementation, server 140 may provide a transmission power level of transceiver 115 to devices, other than mobile device 100. Mobile device 100 may determine a transmission power level of transceiver 115 by measuring a travel time of a signal transmitted between mobile device 100 and transceiver 115. Mobile device 100 may measure signal strength of signal transmitted by transceiver 115 and acquired at mobile device 100. By combining measured travel time of signal with measured signal strength, mobile device 100, or another device, such as server 140, for example, may determine transmission power level. In this embodiment, measured signal strength, and measured RTT values may be transmitted to server 140. Mobile device 100, or server 140, may update transceiver transmission power level at server 140, or other location based service, for example. Other devices receiving location relevant information, such as, but not limited to RTT results, received signal strengths, or transmission power levels, from server 140, may then receive an updated transmission power level for transceiver 115.

Figure 2:
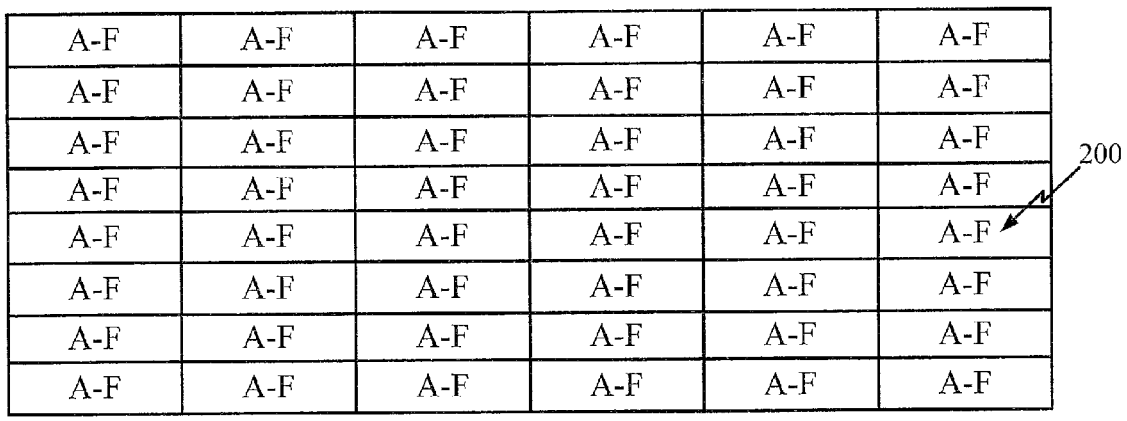
FIG. 2 is a diagram illustrating one embodiment of a heat map.

FIG. 2 is a schematic diagram illustrating one particular implementation of an element 200 for a two-dimensional radio heatmap. A radio heatmap may comprise more than two dimensions. However, this is merely an example of implementation of a radio heatmap with two dimensions, and claimed subject matter is not limited to two dimensions. A single element 200 of a heatmap may include, but is not limited to, a node identifier (ID) 202, expected RSSI signature values 203 and variances 204, expected RTT signature values 205 and variances 206, a Boolean connectivity flag 207, or other values, for example. As shown in the particular example above, an expected RSSI signature value 203 and associated variance 204 for a given node ID 202 may be represented by one byte each while an expected RTT signature value 205 and associated variance 206 for a given node ID 202 may be represented by two bytes each, or more, for example. Additionally, a single field may indicate connectivity 207 (e.g., a feasible path) with adjoining grid points (e.g., Boolean 1 or 0 to indicate whether there is connectivity with an associated grid point).

In one particular implementation, a process for adjusting or updating RSSI signature values may comprise: 1) estimating a range from RTT measurements; 2) estimating a transmission power of the transceiver and a path loss exponent by comparing estimated true range and RSSI measurements; and adjusting the RSSI heatmap according to estimated transmission power of the transceiver and path loss exponent. In an alternative implementation, a pathloss exponent estimate may comprise a predetermined parameter (e.g., from assistance data received from a server). Here, it is recognized adaptive transmission power control in some scenarios transmission power may lead to frequently varying transmission power while a power loss exponent may remain relatively static. As such, a predetermined path loss exponent received as assistance data from a server may be sufficient. In one example implementation, a single or small number of RTT/RSSI measurement pairs may be collected for estimating a transmission power of a transmitter based, at least in part, on a predetermined path loss exponent received in assistance data from a server. In another implementation, a large number of RTT/RSSI measurement pairs may be collected for a transmitter and estimates of transmission power and power loss exponent may be obtained. In this context, a power loss may characterize a difference between a transmission power at a transmitter and a measured received power at a receiver arising at least in part, for example, wireless signal propagation or attenuation. In addition to a range between a transmitter and a receiver, such a power loss may be affected by other factors such as, for example, atmospheric conditions obstructions in a signal path. Here, a "power loss exponent" may comprise a single parameter that may characterize a power loss between a transmitter and a receiver base as a function of one or more factors such as, for example, a range between the transmitter and receiver. It should be understood, however, that this is merely one example of how a power loss exponent may model a path loss between a transmitter and receiver, and claimed subject matter is not limited in this respect.

Figure 3:
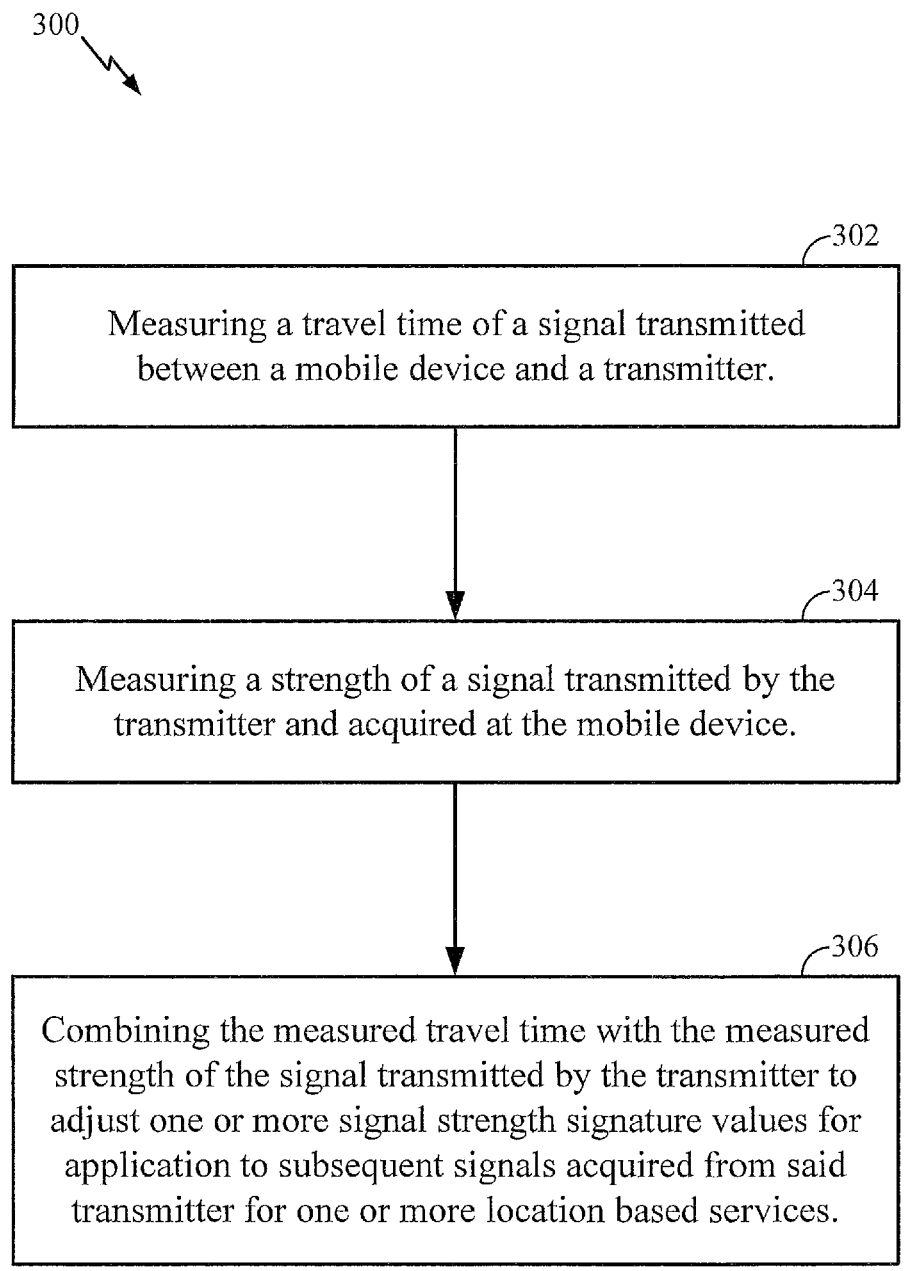
FIG. 3 is a flow diagram illustrating a method by a device in accordance with an implementation.

FIG. 3 is a flowchart illustrating a method of a mobile device in accordance with an implementation. Of course, claimed subject matter is not limited in scope to the particular order or arrangement of blocks shown. Likewise, additional blocks may be included in an embodiment or blocks depicting one or more operations in place of those shown may be used in an embodiment. At block 302, a mobile device may measure a travel time of a signal transmitted between a mobile device and a transmitter. In a particular implementation, mobile device may measure the travel time by transmitting a probe message to a transceiver, acquiring a message from the transceiver responding to the probe message, and measuring a duration from transmission of the probe message to acquisition of the response message as an RTT measurement. At block 304, the mobile device may measure a strength of a signal transmitted by the transmitter and acquired at the mobile device as an RSSI measurement. If a location of the mobile device while measuring a travel time at block 302 is approximately the same location of the mobile device while measuring a signal strength at block 304, at block 306 the travel time measured at block 302 and signal strength measured at block 304 may be combined to adjust one or more expected signal strength values in a radio heatmap. In one example implementation, block 306 may be performed at the mobile device to update adjust one or more expected signal strength values in an image of the radio heatmap stored locally on a memory on the mobile device. Alternatively, a mobile device may transmit one or more messages to a server containing measurements obtained at blocks 302 and 304, while the measurements are combined according to block 306 at the server.

In one particular implementation, block 306 may update or adjust expected RSSI signature values for a transmitter based, at least in part, on an estimate of the transmission power and an estimated path loss. Here block 306 may recognize that a path loss comprises a reduction in the power of a signal as it propagates through a volume of space. Path loss may arise from many effects, such as, but not limited to refraction, diffraction, reflection, coupling losses, absorption, or other, for example. A path loss exponent may effectively estimate a predicted path loss for a given path that a radio frequency signal may travel between a transmitter and a receiver. For example, signals with little interference may have a very low path loss exponent, while signals with significant interference, or loss as previously discussed, may have a very high path loss exponent. As pointed out above in an example implementation, block 306 may be performed in whole or in part at a remote server. In one alternative implementation, one or more mobile devices may provide messages to a server indicating an estimated range to a transmitter computed based on a RTT measurement paired with an RSSI measurement value. Here, the server may then compute an estimated transmission power for the transmitter and estimated path loss based, at least in part, on multiple observations (e.g., ten or more) from the mobile device. In another alternative implementation, a mobile device may compute estimates of the transmitter's transmission power and the path loss over multiple observations (e.g., ten or more), and forward these estimates to the server.

Accumulated samples (measurements or estimates) from mobile devices may be used to update values in a heatmap. In one implementation, in addition to path loss exponent, a mobile device may report an RTT based range measurement in combination with an RSSI measurement. An updated estimate of transmission power level at a transmitter may be calculated using these two values as later discussed. Updated estimated transmission power levels may be transmitted to a server for adjusting and subsequently reporting updated RSSI signature values to other mobile devices.

An RTT range measurement to a transmitter from a given location of a mobile device may comprise a flight time of a probe signal transmitted by the mobile device, added to a time of flight of a response to the probe signal transmitted by a transceiver in response to the probe signal and received at the mobile device, and added to a processing delay at the transceiver may be included in the calculations. Accordingly, a range from the mobile device to the transceiver may be measured according to expression (1) as follows:

$$R_{RTT}=c*(\text{RTT}-\text{Processing Delay})/2; \quad (1)$$

where:

$R_{RTT}$ is a measurement of range to a transmitter computed from RTT;

c is the speed of light; and

Processing Delay is a delay at the transceiver between acquisition of a probe signal and transmission of a response signal.

In particular implementations, a value for Processing Delay may be model or device specific, may not change over time. Additionally, a value for Processing Delay for any particular transceiver may not be subject to any dynamic control. Thus, a transceiver may store a static processing delay value for transmission for transmission to a mobile device or server for use as positioning assistance data.

As pointed out above, RSSI measurements and a value for $R_{RTT}$ may be compared with one another to compute updated or adjusted expected RSSI signatures in a radio heatmap. In one implementation, an expected RSSI value ($RSSI_{exp}$) may be modeled according to expression (2) as follows:

$$RSSI_{meas}=RSSI_0-10*\text{PathLossExp}*\log_{10}(R_{RTT}) \quad (2)$$

where:

$RSSI_{meas}$ is a measured RSSI value obtained in roughly the same location that an RTT measurement is obtained;

$RSSI_0$ is a value for RSSI computed based upon transmitter power; and

PathLossExp is a computed path loss exponent.

In particular implementations, $RSSI_0$ may be defined as a value for RSSI at a range of 1.0 m. A value for PathLossExp may be initially set as being between 1.5 and 2.0 in free space and approximately 2.3~3.0 in an indoor environment. In a particular implementation, values for $RSSI_{meas}$ and $R_{RTT}$ may be known and/or obtained from direct measurement of acquired signals. Parameters may be estimated by applying a "best fit" over multiple paired samples of $RSSI_{meas}$ and $R_{RTT}$ to solve for $RSSI_0$ and PathLossExp over multiple data points. For example, $RSSI_0$ and PathLossExp may be estimated using a linear regression process where these parameters are placed in a vector "x" and measurements of RSSI are placed in a vector "y." A matrix H may be constructed based on $R_{RTT}$. Estimated values for x may then be computed as follows:

$$\hat{x} = (H^T H^T)^{-1} H^T y \quad (4)$$

where:

$$x = \begin{bmatrix} pathLossExp \\ RSSI0 \end{bmatrix}$$

$$y = \begin{bmatrix} RSSI(1) \\ RSSI(2) \\ \vdots \\ RSSI(k) \end{bmatrix}$$

$$H = \begin{bmatrix} 10*\log10(Rrtt(1)) & 1 \\ 10*\log10(Rrtt(2)) & 1 \\ \vdots & \vdots \\ 10*\log10(Rrtt(k)) & 1 \end{bmatrix}$$

As pointed out above an estimated value for a path loss exponent may be predetermined and provided by a server. With such an predetermined estimate of path loss exponent, a value for $RSSI_0$ may be computed according to expression (5) as follows:

$$\overline{RSSI0} = \frac{1}{k}\sum_{i=1}^{k}[RSSI(i) + 10 \times PathLossExpGiven \times \log10(Rrtt(i))] \quad (5)$$

where PathLossExpGiven is a predetermined values for a path loss exponent.

In implementations according to expressions (4) and (5) outlined above, outlier detection and removal may be applied to avoid measurements with large errors by checking against a deviation against measurements. For example, RSSI/RTT measurement pairs for which $RSSI(i)+10\times PathLossExp-Given\times \log_{10}(R_{RTT}(i))$ deviates from $RSSI_0$ by more than a threshold (e.g., 1.0 sigma) may be discarded.

In a particular implementation, a value for $RSSI_0$ may be modeled according to expression (6) as follows:

$$RSSI_0 (dBm)=TX\_PWR (dBm)+20*\log_{10}(\lambda/4\pi) \quad (6)$$

Where:

TX_PWR (dBm) is a transmission power for a particular transmitter; and

λ Is the RF wavelength.

Values for $RSSI_0$ and PathLossExp may be estimated based at least in part, on multiple samples of $RSSI_{meas}$ and $R_{RTT}$ according a "best fit" (e.g., least square error or regression analysis) as discussed above. The estimated value for $RSSI_0$ may be applied to expression (6) to estimate a value for $TX\_PWR (dBm)=RSSI_0 (dBm)-20*\log_{10}(\lambda/4\pi)$.

As pointed out above, in a particular implementation in which a remote server computes updated expected RSSI signature values in a radio heatmap, a mobile device may transmit or upload particular parameters or measurements to the remote server to enable such computation. For example, mobile device may transmit or upload computed values for TX_PWR (dBm) and PathLossExp. Alternatively, the mobile device may transmit or upload computed values for RSSI0 and PathLossExp. Here, it may be observed that values for TX_PWR (dBm) and RSSI0 may be derived from one another based on a fixed relationship. A remote server may compute updated expected RSSI signature values by applying a difference between current and previously known values for PathLossExp and values for either RSSI0 or TX_PWR (dBm).

Alternatively, instead of transmitting or uploading computed values for TX_PWR (dBm) and RSSI0 (e.g., in combination with a computed value for PathLossExp), a mobile may send to a remote server values for deltaPwr (computed as TX_PWR estimated−TX_PWR_given=RSSI0_estimated−RSSI0_given). The remote server may then compute updated expected RSSI signature values by applying a difference between current and previously known values for PathLossExp and a value for deltaPwr.

As may be observed from expression (6), a value for $RSSI_0$ (dBm) may vary from time to time as TX_PWR (dBm) (transmit power of a particular transmitter) drifts as discussed above. Changes in a value of $RSSI_0$ (dBm) may be used to compute an updated expected RSSI signature values in for signals transmitted (e.g., in a radio heatmap) by the particular transmitter according to expression (7) as follows:

$$RSSI_{exp}(t_{n+1})=RSSI_{exp}(t_n)+(RSSI_0(t_{n+1})-RSSI_0(t_n)) \quad (7)$$

where:

$RSSI_{exp}(t_n)$ is an expected RSSI signature value for signals acquired from a transmitter at time $t_n$;

$RSSI_{exp}(t_{n+1})$ is an expected RSSI signature value updated at time $t_{n+1}$ to account for drift in transmission power at the transmitter;

$RSSI_0 (t_n)$ is a value for RSSI computed based upon transmitter power at time $t_n$ computed according to expression (2) according to a best fit; and $RSSI_0 (t_{n+1})$ is a value for RSSI computed based upon transmitter power at time $t_{n+1}$ computed according to expression (2) according to a best fit.

In one particular implementation, an updated expected signature value $RSSI_{exp}(t_{n+1})$ for a particular transmitter may be determined for one particular location identified in a radio heatmap (e.g., at a particular grid point). Here, operations according to expression (4) may be repeated for obtaining an updated expected signature value $RSSI_{exp}(t_{n+1})$ for multiple locations (e.g., grid points) in a radio heatmap.

While a mobile device may obtain an RSSI measurement from a signal transmitted by a transmitter and an acquired at the mobile device, a value of such an RSSI measurement may depend, at least in part, on a the particular receiver of the mobile device obtaining the measurement. For example, different mobile device from different manufacturers, or different models of mobile device from the same manufacturer, may have a different receiver gain to provide a different RSSI measurement value from the same transmitter while positioned at the same receiver location.

In a particular implementation, receiver gains of receivers of mobile devices may be calibrated at the factory so as to provide uniformity in devices obtaining measurements of RSSI. In another implementation, a receiver gain may be calibrated during the life of mobile device operation. In another implementation, even if a receiver gain is not calibrated at the factory or during the life of mobile device operation, a server combining RSSI measurements at block 306 from multiple mobile devices may have a priori knowledge of receiver gains of different makes and models of mobile devices providing the RSSI measurements. The server may then adjust RSSI measurements received from a particular make or model of mobile device according to the known receiver gain. Here, a server may track a deviation in gain per mobile device make/model (e.g., Galaxy=+5.0 dB, Nexus=− 2.0 dB). Alternatively, the server may assume a single error model (e.g., Gaussian error with a mean deviation of 0.0 dB with σ=5.0 dB). While sources of variation in received power may also include motion of the receiver, user body shielding, crowdsourcing and accumulation of a sufficient number of samples may cancel much of this variation. According to an embodiment, a server may give measurements of transmission power from devices deemed to be more reliable may be given greater weight. For example, a reference receiver (e.g., a mobile device or access transceiver) may be located at a known fixed location. Accordingly, if a location of an access transceiver is known, a range or distance between the reference receiver and the access transceiver may also be known. Accordingly, any changes in RSSI of signals received at the reference receiver transmitted by the access transceiver may provide a very accurate indication of changes in transmission power at the access transceiver. In addition, measurements of RSSI obtained at the reference receiver may be smoothed or averaged over time to improve accuracy of an estimated transmission power of the access transceiver. At the server end, RSSI measurements received from a reference receiver positioned at a known location (again, presumed to be particularly accurate because of the known distance or range between the reference receiver and the access transceiver) may be given greater weight in estimating transmission power of the access transceiver than RSSI measurements obtained from other devices.

Figure 4:
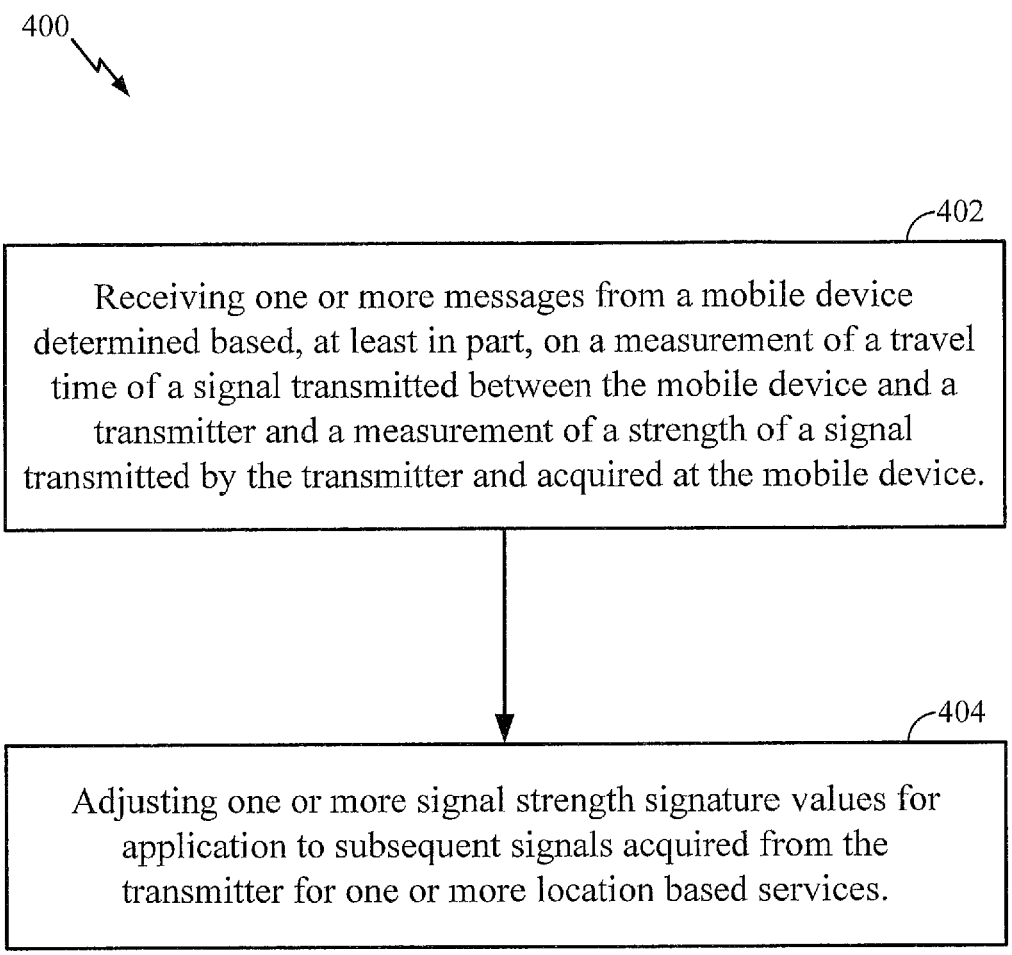
FIG. 4 is a flow diagram illustrating a method by a server in accordance with an implementation.

FIG. 4 is a flowchart illustrating a method by a server in accordance with an implementation. Of course, claimed subject matter is not limited in scope to the particular order or arrangement of blocks shown. Likewise, additional blocks may be included in an embodiment or blocks depicting one or more operations in place of those shown may be used in an embodiment. In FIG. 4. a server may receive one or more messages from a mobile device determined based, at least in part, on a measurement of a travel time of a signal transmitted between the mobile device and a transmitter and a measurement of a strength of a signal transmitted by the transmitter and acquired at the mobile device 402. Therefore, a message may comprise, but is not limited to, a received signal strength, a measured round-trip time, an estimated transmission power level, a signal strength signature value, or other, for example. As pointed out above in one alternative implementation, a server may receive estimates of transmission power and estimated path loss. As pointed out in an alternative implementation, a remote server may receive RTT range measurements paired with RSSI measurement values. The server may adjust one or more signal strength signature values for application to location based services. Here, the server may apply one or more techniques described above in connection with block 306 of FIG. 3. Subsequent signals acquired from the transmitter may determine more accurate location based, at least in part, on updated or adjusted signal strength signature values 404.

Figure 5:
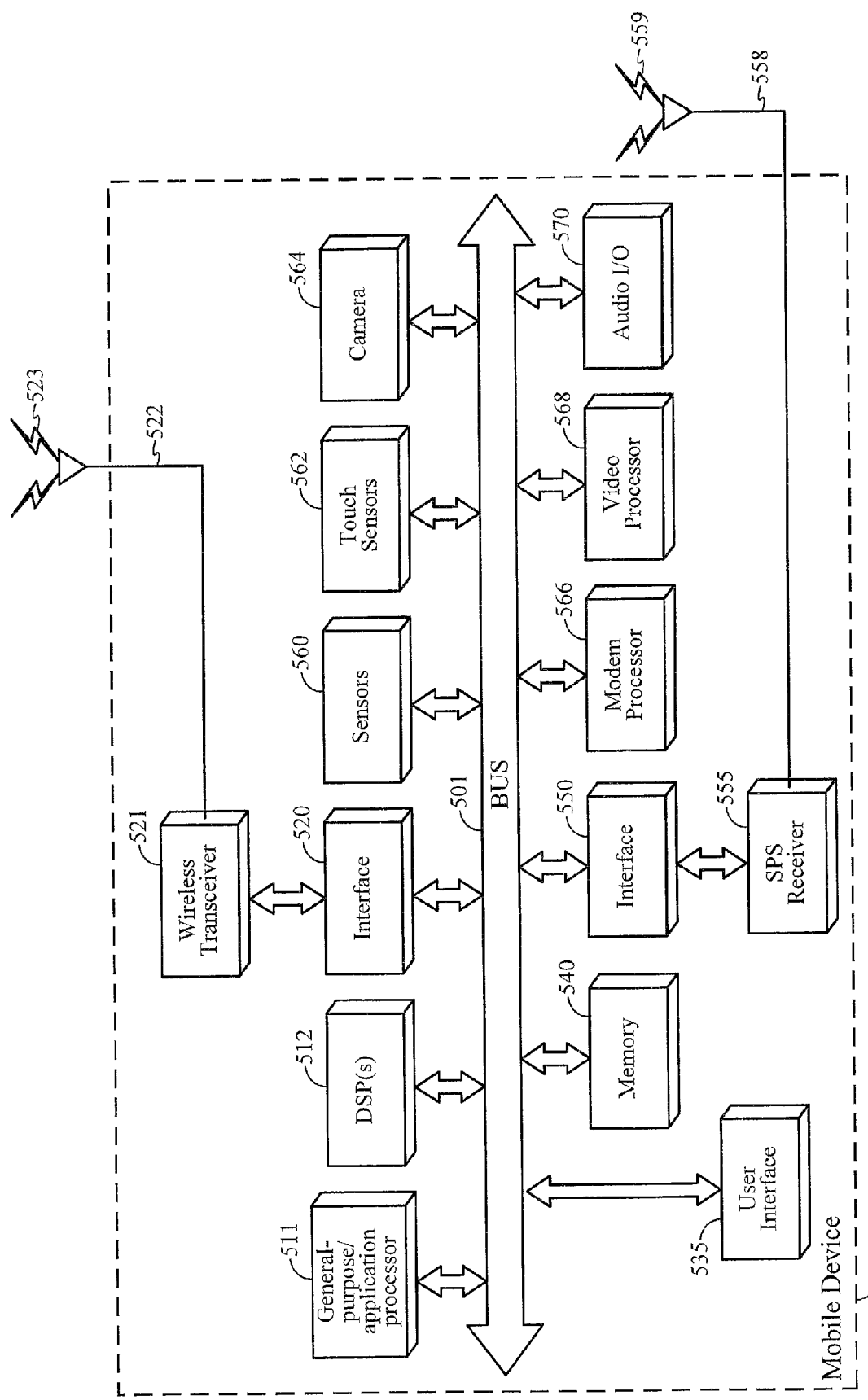
FIG. 5 is a schematic block diagram illustrating an exemplary device, in accordance with an implementation.

FIG. 5 is a schematic diagram of a mobile device according to an embodiment. Mobile device 100 (FIG. 1) may comprise one or more features of mobile device 500 shown in FIG. 5. In certain embodiments, mobile device 500 may also comprise a wireless transceiver 521 which is capable of transmitting and receiving wireless signals 523 via an antenna 522 over a wireless communication network. Wireless transceiver 521 may be connected to bus 501 by a wireless transceiver bus interface 520. Wireless transceiver bus interface 520 may, in some embodiments be at least partially integrated with wireless transceiver 521. Some embodiments may include multiple wireless transceivers 521 and wireless antennas 522 to enable transmitting and/or receiving signals according to a corresponding multiple wireless communication standards such as, for example, WiFi, CDMA, WCDMA, LTE and Bluetooth, just to name a few examples.

Mobile device 500 may also comprise SPS receiver 555 capable of receiving and acquiring SPS signals 559 via SPS antenna 558. SPS receiver 555 may also process, in whole or in part, acquired SPS signals 559 for estimating a location of mobile device 500. In some embodiments, general-purpose processor(s) 511, memory 540, DSP(s) 512 and/or specialized processors (not shown) may also be utilized to process acquired SPS signals, in whole or in part, and/or calculate an estimated location of mobile device 500, in conjunction with SPS receiver 555. Storage of SPS or other signals for use in performing positioning operations may be performed in memory 540 or registers (not shown).

Also shown in FIG. 5, mobile device 500 may comprise digital signal processor(s) (DSP(s)) 512 connected to the bus 501 by a bus interface 510, general-purpose processor(s) 511 connected to the bus 501 by a bus interface 510 and memory 540. Bus interface 510 may be integrated with the DSP(s) 512, general-purpose processor(s) 511 and memory 540. In various embodiments, functions may be performed in response execution of one or more machine-readable instructions stored in memory 540 such as on a computer-readable storage medium, such as RAM, ROM, FLASH, or disc drive, just to name a few example. The one or more instructions may be executable by general-purpose processor(s) 511, specialized processors, or DSP(s) 512. Memory 540 may comprise a non-transitory processor-readable memory and/or a computer-readable memory that stores software code (programming code, instructions, etc.) that are executable by processor(s) 511 and/or DSP(s) 512 to perform functions described herein.

Also shown in FIG. 5, a user interface 535 may comprise any one of several devices such as, for example, a speaker, microphone, display device, vibration device, keyboard, touch screen, just to name a few examples. In a particular implementation, user interface 535 may enable a user to interact with one or more applications hosted on mobile device 500. For example, devices of user interface 535 may store analog or digital signals on memory 240 to be further processed by DSP(s) 512 or general purpose processor 511 in response to action from a user. Similarly, applications hosted on mobile device 500 may store analog or digital signals on memory 540 to present an output signal to a user. In another implementation, mobile device 500 may optionally include a dedicated audio input/output (I/O) device 570 comprising, for example, a dedicated speaker, microphone, digital to analog circuitry, analog to digital circuitry, amplifiers and/or gain control. It should be understood, however, that this is merely an example of how an audio I/O may be implemented in a mobile device, and that claimed subject matter is not limited in this respect. In another implementation, mobile device 500 may comprise touch sensors 562 responsive to touching or pressure on a keyboard or touch screen device.

Mobile device 500 may also comprise a dedicated camera device 564 for capturing still or moving imagery. Camera device 564 may comprise, for example an imaging sensor (e.g., charge coupled device or CMOS imager), lens, analog to digital circuitry, frame buffers, just to name a few examples. In one implementation, additional processing, conditioning, encoding or compression of signals representing captured images may be performed at general purpose/application processor 511 or DSP(s) 512. Alternatively, a dedicated video processor 568 may perform conditioning, encoding, compression or manipulation of signals representing captured images. Additionally, video processor 568 may decode/decompress stored image data for presentation on a display device (not shown) on mobile device 500.

Mobile device 500 may also comprise sensors 560 coupled to bus 501 which may include, for example, inertial sensors and environment sensors. Inertial sensors of sensors 560 may comprise, for example accelerometers (e.g., collectively responding to acceleration of mobile device 500 in three dimensions), one or more gyroscopes or one or more magnetometers (e.g., to support one or more compass applications). Environment sensors of mobile device 500 may comprise, for example, temperature sensors, barometric pressure sensors, ambient light sensors, camera imagers, microphones, just to name few examples. Sensors 560 may generate analog or digital signals that may be stored in memory 540 and processed by DPS(s) or general purpose processor 511 in support of one or more applications such as, for example, applications directed to positioning or navigation operations.

In a particular implementation, mobile device 500 may comprise a dedicated modem processor 566 capable of performing baseband processing of signals received and downconverted at wireless transceiver 521 or SPS receiver 555. Similarly, modem processor 566 may perform baseband processing of signals to be upconverted for transmission by wireless transceiver 521. In alternative implementations, instead of having a dedicated modem processor, baseband processing may be performed by a general purpose processor or DSP (e.g., general purpose/application processor 511 or DSP(s) 512). It should be understood, however, that these are merely examples of structures that may perform baseband processing, and that claimed subject matter is not limited in this respect. In particular applications, mobile device 500 may be capable of performing some or all of actions at blocks 302, 304 and 306 described above with reference to FIG. 3.

Figure 6:
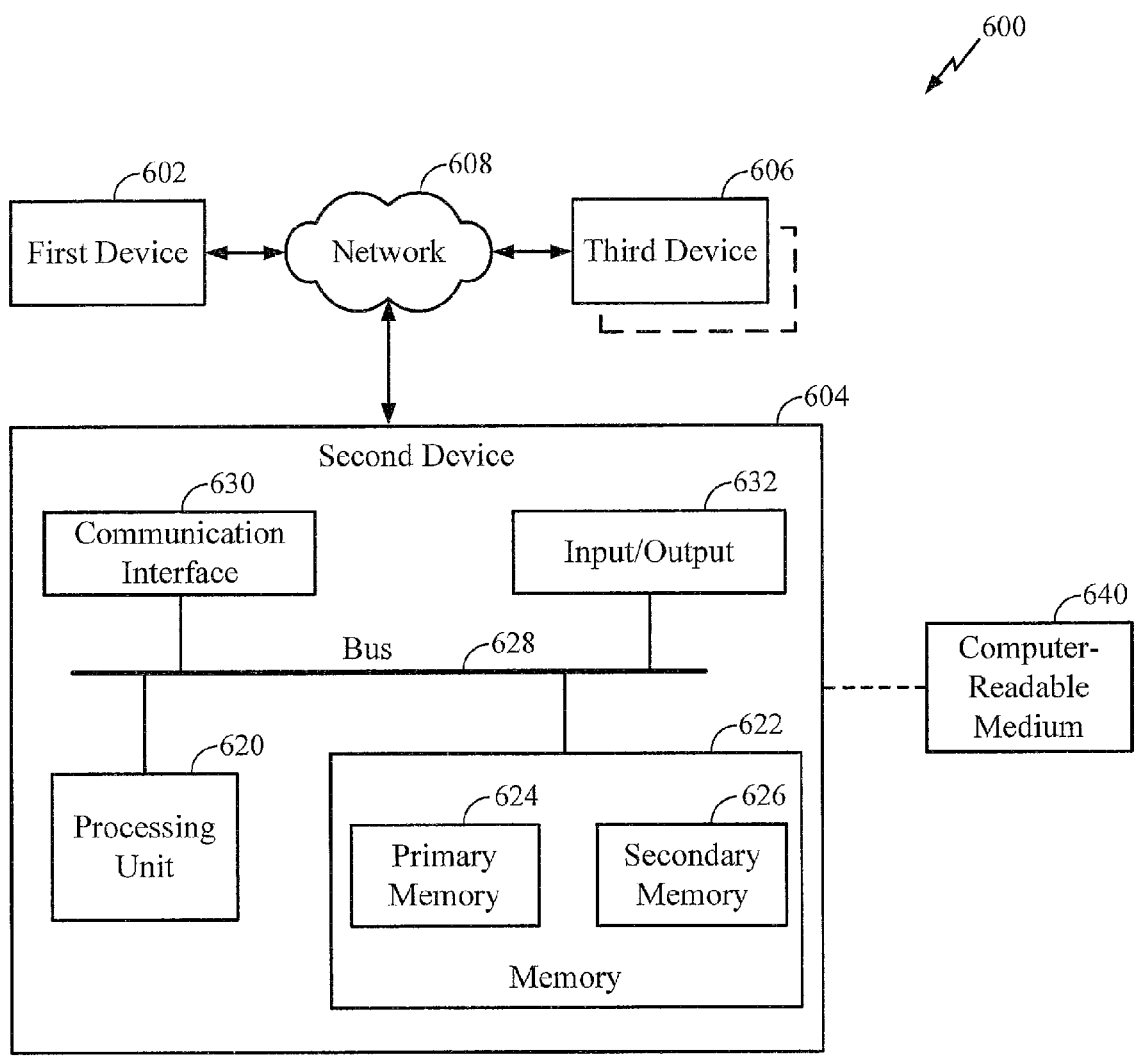
FIG. 6 is a schematic block diagram of an example computing platform in accordance with an implementation.

FIG. 6 is a schematic diagram illustrating an example system 600 that may include one or more devices configurable to implement techniques or processes described above, for example, in connection with FIG. 1. System 600 may include, for example, a first device 602, a second device 604, and a third device 606, which may be operatively coupled together through a wireless communications network 608. In an aspect, first device 602 may comprise a server capable of providing positioning assistance data such as, for example, a base station almanac. First device 602 may also comprise a server capable of providing an LCI to a requesting mobile device based, at least in part, on a rough estimate of a location of the requesting mobile device. First device 602 may also comprise a server capable of providing indoor positioning assistance data relevant to a location of an LCI specified in a request from a mobile device. Second and third devices 604 and 606 may comprise mobile devices, in an aspect. Also, in an aspect, wireless communications network 608 may comprise one or more wireless access points, for example. However, claimed subject matter is not limited in scope in these respects.

First device 602, second device 604 and third device 606, as shown in FIG. 6, may be representative of any device, appliance or machine that may be configurable to exchange data over wireless communications network 608. By way of example but not limitation, any of first device 602, second device 604, or third device 606 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or data storage service provider/system, a network service provider/system, an Internet or intranet service provider/system, a portal or search engine service provider/system, a wireless communication service provider/system; or any combination thereof. Any of the first, second, and third devices 602, 604, and 606, respectively, may comprise one or more of a base station almanac server, a base station, or a mobile device in accordance with the examples described herein.

Similarly, wireless communications network 608, as shown in FIG. 6, is representative of one or more communication links, processes, or resources configurable to support the exchange of data between at least two of first device 602, second device 604, and third device 606. By way of example but not limitation, wireless communications network 608 may include wireless or wired communication links, telephone or telecommunications systems, data buses or channels, optical fibers, terrestrial or space vehicle resources, local area networks, wide area networks, intranets, the Internet, routers or switches, and the like, or any combination thereof. As illustrated, for example, by the dashed lined box illustrated as being partially obscured of third device 606, there may be additional like devices operatively coupled to wireless communications network 608.

It is recognized that all or part of the various devices and networks shown in system 600, and the processes and methods as further described herein, may be implemented using or otherwise including hardware, firmware, software, or any combination thereof.

Thus, by way of example but not limitation, second device 604 may include at least one processing unit 620 that is operatively coupled to a memory 622 through a bus 628.

Processing unit 620 is representative of one or more circuits configurable to perform at least a portion of a data computing procedure or process. By way of example but not limitation, processing unit 620 may include one or more processors, controllers, microprocessors, microcontrollers, application specific integrated circuits, digital signal processors, programmable logic devices, field programmable gate arrays, and the like, or any combination thereof.

Memory 622 is representative of any data storage mechanism. Memory 622 may include, for example, a primary memory 624 or a secondary memory 626. Primary memory 624 may include, for example, a random access memory, read only memory, etc. While illustrated in this example as being separate from processing unit 620, it should be understood that all or part of primary memory 624 may be provided within or otherwise co-located/coupled with processing unit 620.

Secondary memory 626 may include, for example, the same or similar type of memory as primary memory or one or more data storage devices or systems, such as, for example, a disk drive, an optical disc drive, a tape drive, a solid state memory drive, etc. In certain implementations, secondary memory 626 may be operatively receptive of, or otherwise configurable to couple to, a computer-readable medium 640. Computer-readable medium 640 may include, for example, any non-transitory medium that can carry or make accessible data, code or instructions for one or more of the devices in system 600. Computer-readable medium 640 may also be referred to as a storage medium.

Second device 604 may include, for example, a communication interface 630 that provides for or otherwise supports the operative coupling of second device 604 to at least wireless communications network 608. By way of example but not limitation, communication interface 630 may include a network interface device or card, a modem, a router, a switch, a transceiver, and the like.

Second device 604 may include, for example, an input/output device 632. Input/output device 632 is representative of one or more devices or features that may be configurable to accept or otherwise introduce human or machine inputs, or one or more devices or features that may be configurable to deliver or otherwise provide for human or machine outputs. By way of example but not limitation, input/output device 632 may include an operatively configured display, speaker, keyboard, mouse, trackball, touch screen, data port, etc. In particular applications, second device 604 may be capable of performing actions at blocks 402 and 404 described above with reference to FIG. 4.

The methodologies described herein may be implemented by various means depending upon applications according to particular examples. For example, such methodologies may be implemented in hardware, firmware, software, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Wireless communication techniques described herein may be in connection with various wireless communications networks such as a wireless wide area network ("WWAN"), a wireless local area network ("WLAN"), a wireless personal area network (WPAN), and so on. The term "network" and "system" may be used interchangeably herein. A VIA/VAN may be a Code Division Multiple Access ("CDMA") network, a Time Division Multiple Access ("TDMA") network, a Frequency Division Multiple Access ("FDMA") network, an Orthogonal Frequency Division Multiple Access ("OFDMA") network, a Single-Carrier Frequency Division Multiple Access ("SC-FDMA") network, or any combination of the above networks, and so on. A CDMA network may implement one or more radio access technologies ("RATs") such as cdma2000, Wideband-CDMA ("W-CDMA"), to name just a few radio technologies. Here, cdma2000 may include technologies implemented according to IS-95, IS-2000, and IS-856 standards. A TDMA network may implement Global System for Mobile Communications ("GSM"), Digital Advanced Mobile Phone System ("D-AMPS"), or some other RAT. GSM and W-CDMA are described in documents from a consortium named "3rd Generation Partnership Project" ("3GPP"). Cdma2000 is described in documents from a consortium named "3rd Generation Partnership Project 2" ("3GPP2"). 3GPP and 3GPP2 documents are publicly available. 4G Long Term Evolution ("LTE") communications networks may also be implemented in accordance with claimed subject matter, in an aspect. A WLAN may comprise an IEEE 802.11x network, and a WPAN may comprise a Bluetooth network, an IEEE 802.15x, for example. Wireless communication implementations described herein may also be used in connection with any combination of WWAN, WLAN or WPAN.

In another aspect, as previously mentioned, a wireless transmitter or access point may comprise a femto cell, utilized to extend cellular telephone service into a business or home. In such an implementation, one or more mobile devices may communicate with a femto cell via a code division multiple access ("CDMA") cellular communication protocol, for example, and the femto cell may provide the mobile device access to a larger cellular telecommunication network by way of another broadband network such as the Internet.

Techniques described herein may be used with an SPS that includes any one of several GNSS and/or combinations of GNSS. Furthermore, such techniques may be used with positioning systems that utilize terrestrial transmitters acting as "pseudolites", or a combination of SVs and such terrestrial transmitters. Terrestrial transmitters may, for example, include ground-based transmitters that broadcast a PN code or other ranging code (e.g., similar to a GPS or CDMA cellular signal). Such a transmitter may be assigned a unique PN code so as to permit identification by a remote receiver. Terrestrial transmitters may be useful, for example, to augment an SPS in situations where SPS signals from an orbiting SV might be unavailable, such as in tunnels, mines, buildings, urban canyons or other enclosed areas. Another implementation of pseudolites is known as radio-beacons. The term "SV", as used herein, is intended to include terrestrial transmitters acting as pseudolites, equivalents of pseudolites, and possibly others. The terms "SPS signals" and/or "SV signals", as used herein, is intended to include SPS-like signals from terrestrial transmitters, including terrestrial transmitters acting as pseudolites or equivalents of pseudolites.

The terms, "and," and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Reference throughout this specification to "one example" or "an example" means that a particular feature, structure, or characteristic described in connection with the example is included in at least one example of claimed subject matter. Thus, the appearances of the phrase "in one example" or "an example" in various places throughout this specification are not necessarily all referring to the same example. Furthermore, the particular features, structures, or characteristics may be combined in one or more examples. Examples described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A method for estimating transmission power comprising, at a mobile device:
    obtaining a measurement of travel time of a first signal transmitted between the mobile device and a second device;
    obtaining a measurement of a signal strength of a second signal transmitted by said second device and received at the mobile device; and
    computing an estimated transmission power of the second device to adjust one or more expected signal strength signature values for application to subsequent signals acquired from the second device,
    wherein the estimated transmission power is at least based on the measurement of the travel time and at least based on he measurement of the signal strength.

2. The method of claim 1 wherein the computing of the estimated transmission power of the second device applies to one or more location based services.

3. The method of claim 1, wherein the computing of the estimated transmission power of the second device is based, at least in part, on an estimated path loss based, at least in part, on said measurement of the signal strength and the measurement of the travel time, the method further comprising:
    transmitting the computed estimated transmission power and the estimated path loss to a server for use in computing the adjusted one or more expected signal strength signature values.

4. The method of claim 1, wherein the one or more expected signal strength signature values are at multiple grid point locations of an indoor area defined by a radio heatmap.

5. The method of claim 1, wherein said measurement of the travel time is determined based, at least in part, on a measured round trip time.

6. The method of claim 1, wherein the mobile device has a receiver and wherein the computing of the estimated transmission power further comprises adjusting said measurement of said signal strength based, at least in part, on a type of the receiver.

7. The method of claim 1 further comprising transmitting the computed estimated transmission power to a server for use in computing the adjusted one or more expected signal strength signature values.

8. A mobile device comprising:
    a memory; and
    one or more processors in communication with the memory, wherein the one or more processors are configured to:
    obtain a measurement of travel time of a first signal transmitted between the mobile device and a second device;
    obtain a measurement of a signal strength of a second signal transmitted by said second device and received at the mobile device; and
    compute an estimated transmission power of the second device to adjust one or more expected signal strength signature values for application to subsequent signals acquired from the second device,
    wherein the estimated transmission power is at least based on the measurement of the travel time and at least based on the measurement of the signal strength.

9. The mobile device of claim 8, wherein the one or more expected signal strength signature values are at multiple grid point locations of an indoor area defined by a radio heatmap.

10. The mobile device of claim 8, wherein said measurement of the travel time is determined based, at least in part, on a measured round trip time.

11. The mobile device of claim 8, wherein the mobile device has a receiver, and wherein the one or more processors are further configured to compute the estimated transmission power by adjusting said measurement of said signal strength based, at least in part, on a type of the receiver of the mobile device.

12. The mobile device of claim 8, wherein the computed estimated transmission power of the second device is based, at least in part, on an estimated path loss based, at least in part, on said measurement of the signal strength and the measurement of the travel time, and wherein the one or more processors are further configured to:
    initiate transmission of the computed estimated transmission power and the estimated path loss to a server for use in computing the adjusted one or more expected signal strength signature values.

13. An article comprising:
    a non-transitory storage medium comprising machine-readable instructions stored thereon which are executable by a mobile device to:
    obtain a measurement of travel time of a first signal transmitted between the mobile device and a second device;
    obtain a measurement of a signal strength of a second signal transmitted by said second device and received at said mobile device; and compute an estimated transmission power of the second device to adjust one or more expected signal strength signature values for application to subsequent signals acquired from the second device, wherein the estimated transmission power is at least based on the measurement of the travel time and at least based on the measurement of the signal strength.

14. The article of claim 13, wherein the one or more expected signal strength signature values are at multiple grid point locations of an indoor area defined by a radio heatmap.

15. The article of claim 13, wherein said measurement of the travel time is determined based, at least in part, on a measured round trip time.

16. The article of claim 13, wherein the mobile device has a receiver and wherein the instructions are further executable by said mobile device to compute the estimated transmission power further by adjusting said measurement of said signal strength based, at least in part, on a type of the receiver.

17. The article of claim 13, wherein the computed estimated transmission power of the second device is based, at least in part, on an estimated path loss based, at least in part, on said measurement of the signal strength and the measurement of the travel time, and wherein the instructions are further executable by the mobile device to:

initiate transmission of the computed estimated transmission power and the estimated path loss to a server for use in computing the adjusted one or more expected signal strength signature values.

18. A mobile device comprising:

means for obtaining a measurement of travel time of a first signal transmitted between the mobile device and a second device;

means for obtaining a measurement of a signal strength of a second signal transmitted by said second device and received at the mobile device; and means for computing an estimated transmission power of the second device to adjust one or more expected signal strength signature values for application to subsequent signals acquired from the second device, wherein the estimated transmission power is at least based on the measurement of the travel time and at least based on the measurement of the signal strength.

19. The mobile device of claim 18, wherein the means for computing the estimated transmission power of the second device is based, at least in part, on an estimated path loss based, at least in part, on said measurement of the signal strength and the measurement of the travel time, the mobile device further comprising:

means for transmitting the computed estimated transmission power and the estimated path loss to a server for use in computing the adjusted one or more expected signal strength signature values.

20. The mobile device of claim 18, wherein the one or more expected signal strength signature values are at multiple grid point locations of an indoor area defined by a radio heatmap.

21. The mobile device of claim 18, wherein said measurement of the travel time is determined based, at least in part, on a measured round trip time.

22. The mobile device of claim 18, wherein the means for obtaining the measurement of the signal strength includes a receiver, and wherein said means for computing the estimated transmission power further comprises means for adjusting said measurement of said signal strength based, at least in part, on a type of the receiver.

* * * * *